United States Patent [19]
Marek et al.

[11] Patent Number: 5,187,430
[45] Date of Patent: Feb. 16, 1993

[54] METHOD AND APPARATUS FOR DETERMINING NETS AMONG NODES IN A CIRCUIT BOARD

[75] Inventors: James E. Marek, Cypress; Douglas A. Goss, Spring, both of Tex.

[73] Assignee: Compaq Computer Corporation, Houston, Tex.

[21] Appl. No.: 752,848

[22] Filed: Aug. 30, 1991

[51] Int. Cl.$^5$ .................... G01R 31/02; G01R 31/28
[52] U.S. Cl. ........................................ 324/66; 324/519; 324/537
[58] Field of Search ............... 324/66, 158 R, 158 F, 324/500, 519, 537

[56] References Cited
U.S. PATENT DOCUMENTS

| | | | |
|---|---|---|---|
| 3,975,680 | 8/1976 | Webb | 324/158 R |
| 4,229,693 | 10/1980 | Irick et al. | 324/158 F |
| 4,565,966 | 1/1986 | Burr et al. | 324/519 |
| 4,583,042 | 4/1986 | Riemer | 324/537 X |
| 5,006,808 | 4/1991 | Watts | 324/537 |
| 5,059,897 | 10/1991 | Aton et al. | 324/158 R |

*Primary Examiner*—Gerard R. Strecker
*Attorney, Agent, or Firm*—Pravel, Gambrell, Hewitt, Kimball & Krieger

[57] ABSTRACT

Method and apparatus for determining nets among nodes in a circuit board that includes applying a potential to a reference conducting surface oriented with respect to the board; measuring a parameter of an electrical response at a node of interest; and comparing the measurements to determine a plurality of nets among the nodes. The tentative net list developed from the measured parameters is then verified using continuity testing.

20 Claims, 7 Drawing Sheets

METHOD AND APPARATUS FOR DETERMINING NETS AMONG NODES IN A CIRCUIT BOARD

FIELD OF THE INVENTION

The invention relates to a method and apparatus for determining nets among nodes in circuit boards.

BACKGROUND OF THE INVENTION

Circuit boards, especially computer system boards, are complex structures wherein nodes on either side of the board are conductively linked into a multiplicity of "nets." The word "net" is used herein to refer to a set of nodes on the board that are in conductive communication. Boards typically are comprised of a sandwich of layers, some conductive, some insulating. The nets may extend through, or on, either surface or any layer. Complex systems, such as personal computers, utilize multilayer boards, including various power and ground planes and numerous interconnect layers, all of which are separated by insulating layers.

Upon occasion it becomes useful to determine, independently from any design specifications or other information, the actual nets on a board or a portion of a board. Such information might be useful, for instance, for the purpose of verifying that actual nets agree with the design specifications or for reverse engineering. While a simple visual inspection is easiest, the traces, or means of conductive communication on the interconnect layers between the nodes, are largely indecipherable visually when a multi-layer board is utilized. The interconnect layers are not visible through the insulating layers and so simple visual tracing is impossible.

The existing method used to determine nets among nodes of interest on a circuit board is implemented by applying a source of voltage to one node and connecting sequentially every other node of interest with a current sensing probe to determine whether the circuit closes. If the circuit closes, the two nodes are part of the same net. This is commonly referred to as a continuity test or buzzing out a board.

The problem with the above technique is that, for one sequential pass over the board, no information is gained as to the proper net of the nodes where no current is detected. One sequential pass results in the determination of only one net. Determining a second net thus requires a second pass over the remaining nodes of interest, applying the voltage source to one of the remaining nodes. This procedure must be performed in an iterative loop until all of the nodes have been examined. Given the complexity of modern circuit boards, this can be a very lengthy process. It is therefore clearly desirable to have a technique to speed up the process.

SUMMARY OF THE INVENTION

This invention concerns an improved method for determining nets among nodes in a circuit board. It also concerns a novel combination and interaction of equipment for making that determination. According to the method of this invention, an operator arranges to apply an electrical stimulus to a reference conducting surface oriented with respect to the board. As used here, the words "apply an electrical stimulus" are intended to encompass applying a voltage and/or applying a current, either AC or DC. A "reference conducting surface" might be any suitable conducting surface oriented with respect to the board, or within the board, such that it is possible to charge the conducting surface, or subject the conducting surface to the electrical stimulus, and create a set of electrical responses among the nets of the board. This set should be able to be characterized by measuring a suitable parameter of the electrical response. The orientation of the conducting surface could be any orientation, fixed or not fixed, that generates suitable parameters for measurement. The conducting surface might comprise the power plane or the ground plane of the board. The comparison develops a large majority of the nets, with some nodes remaining undetermined. The tentative nets are confirmed using continuity testing, with the remaining nodes being placed in nets or being indicated as unconnected based on further continuity testing.

Applying a potential to a reference conducting surface differs from the existing method, discussed above, used to determine nets among nodes. The existing method subjects one node (and hence, just one net) to a voltage source. The electrical stimulus applied to the reference conducting surface of the present invention affects, to different extents, every net on the board.

After an electrical stimulus has been applied to a conducting surface, a parameter of an electrical response is measured at the nodes of interest on the board. The most likely electrical parameter to be measured is an impedance parameter. Capacitance offers one example.

These two steps, (1) applying an electrical stimulus to a conducting surface, and (2) measuring the response at a node, may be repeated for a plurality of potentials applied to the conducting surface, and/or a plurality of conducting surfaces. One or more pieces of response data is solicited for each node of interest on the board. Most efficiently, all of the response data from one node is gathered at the same time, before moving to another node. Subsequently, the measurements are compared to determine a plurality of nets among the nodes on the board.

In the preferred embodiment discussed below, a capacitance meter applies a voltage to one or more "reference planes." These "reference planes" are either planes within the board itself, such as the ground plane and/or the power plane, or one or more external planes, constructed for use with this invention. In most instances, it is believed that gathering a plurality of response data at each node increases the accuracy of determining nets among nodes using this technique.

The novel combination of equipment involved in the present invention includes a means for applying an electrical stimulus to a reference conducting surface, a means for measuring a parameter of an electrical response at the nodes of interest on the board, and a means for determining a net list, or a plurality of nets, from among the nodes tested. The preferred embodiment of the invention, discussed below, contemplates utilizing a high precision capacitance meter as the means for applying the electrical stimulus and measuring responses. Stimuli are also applied to selected reference planes. Suitable reference planes may exist in the board itself. Alternately, external reference planes may be utilized. In the preferred embodiment, a host computer is integrated into the system to store data, to partially automate the process, and to perform the calculations to determine the net list from the measured response data. A relay switch box, controlled by the host computer, may, in addition, interface between the capacitance meter and the board to aid in automating the process of applying a series of electric stimuli to the board with a single probe placement by the operator. A foot pedal can be added to signal to the computer when the operator has moved a probe to another node. Further, a system that tests nets in accordance with the existing continuity method, discussed above, is tied into the computer to automate the verification of nets among nodes determined with the method of the present invention and to resolve any ambiguous net list data.

DETAILED DESCRIPTION OF THE PREFERRED EMBODIMENT

Figure 1A:
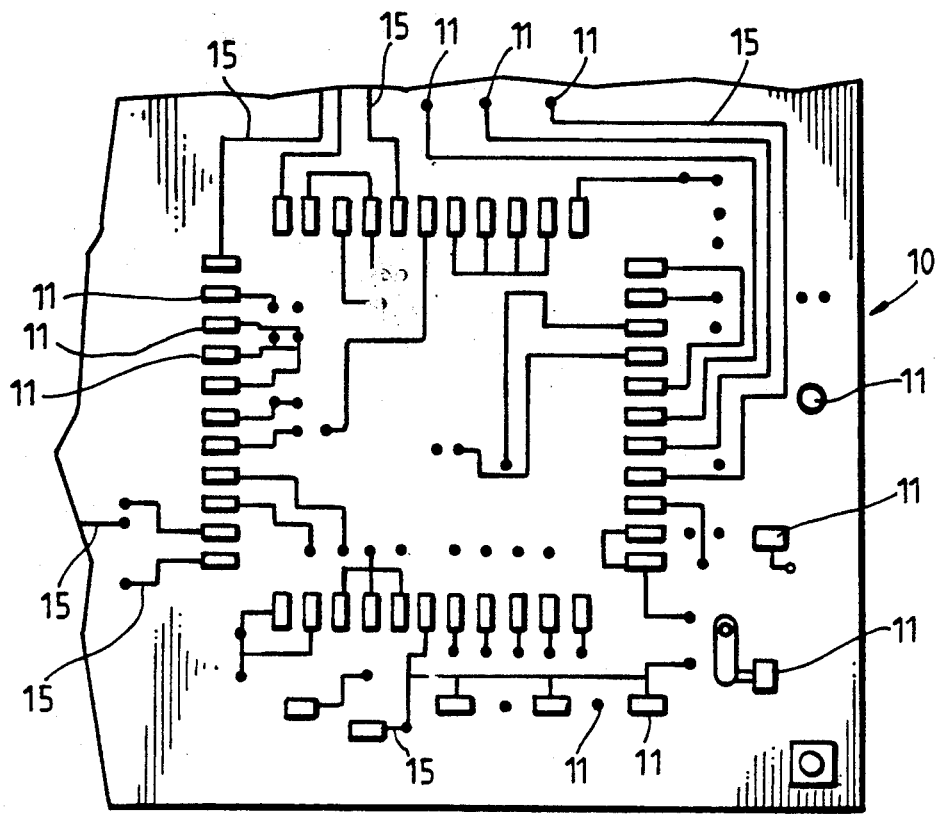
FIG. 1A is an illustration of a portion of one side of a circuit board.

FIG. 1A is a representation of a portion of a personal computer circuit board 10. FIG. 1A illustrates the nodes 11 and the traces 15 between nodes 11 that are visually evident on the surface of board 10. These traces 15 offer some indication of the nets. This limited drawing is utilized for simplicity, with the actual complexity and construction of circuit boards being well known to those skilled in the art.

For the purposes of the preferred embodiment, it will be assumed that it is of interest to determine the nets linking the various nodes 11 of board 10 and that every node 11 on both sides of the board 10 is a "node of interest" for the net list determination. In an actual net list determination process, it may be possible to eliminate some nodes as not being of interest, those nodes typically being the "vias" or interconnection tubes between the various layers.

Figure 1B:
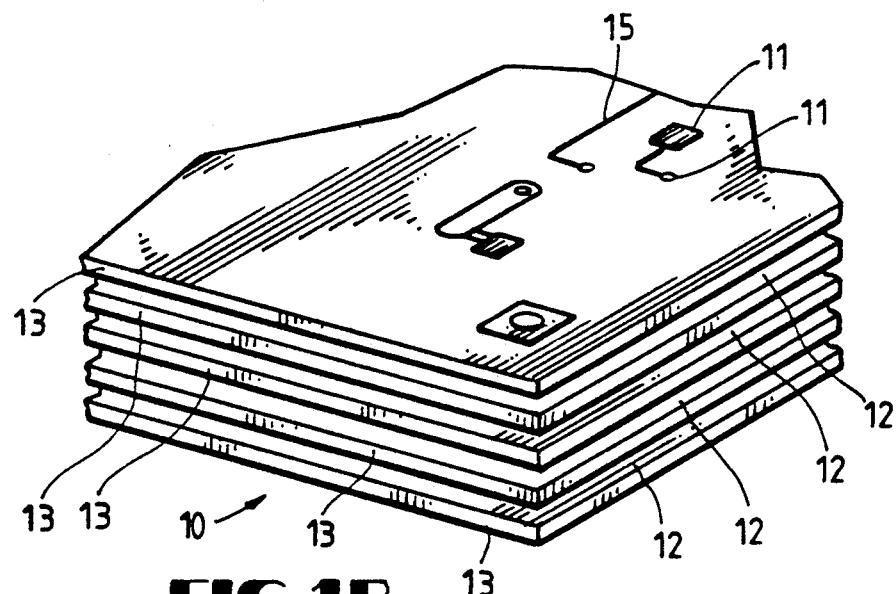
FIG. 1B is an exaggerated illustration of the layers of a circuit board at a board corner.

As illustrated in the drawing of FIG. 1B, the circuit board 10 comprises a sandwich of layers. These layers, some of which are conducting (illustrated by layers 12) and some of which are insulating (illustrated by layers 13), are largely not visible to the naked eye. One such layer may comprise the board's power plane. One such layer may comprise the board's ground plane. Commonly, multiple power and ground planes are utilized for shielding purposes, while numerous conducting or interconnect layers are utilized as needed. Communication between nodes may take place through, or by use of, one or more of these layers.

Given a circuit board 10 whose net list is to be determined by the present invention, the first determination that needs to be made is the reference conducting surfaces to be used and the electrical stimuli that should be applied to the conducting surfaces. This is related to the determination of the appropriate parameter of electrical response to be measured to most effectively determine the net list. The preferred embodiment illustrated herein selects the potential generated by a high precision capacitance meter as the electrical stimuli and measures a capacitance-based response. Resistance offers another possible response to be measured, and resistance could be measured in both polarities and using various source potentials so that a number of different stimuli could be applied.

Having decided to use a high precision capacitance meter, appropriate reference conducting surfaces need to be selected for the meter. Board 10 of the present example is illustrated as containing four conducting layers 12, two of which could be used as reference conducting surfaces. These two conducting surfaces in the present example are the ground plane and the power plane. In addition, for the purposes of this example, one external reference conducting surface 50 (FIG. 2B) having two conducting planes is utilized.

Figure 2A:
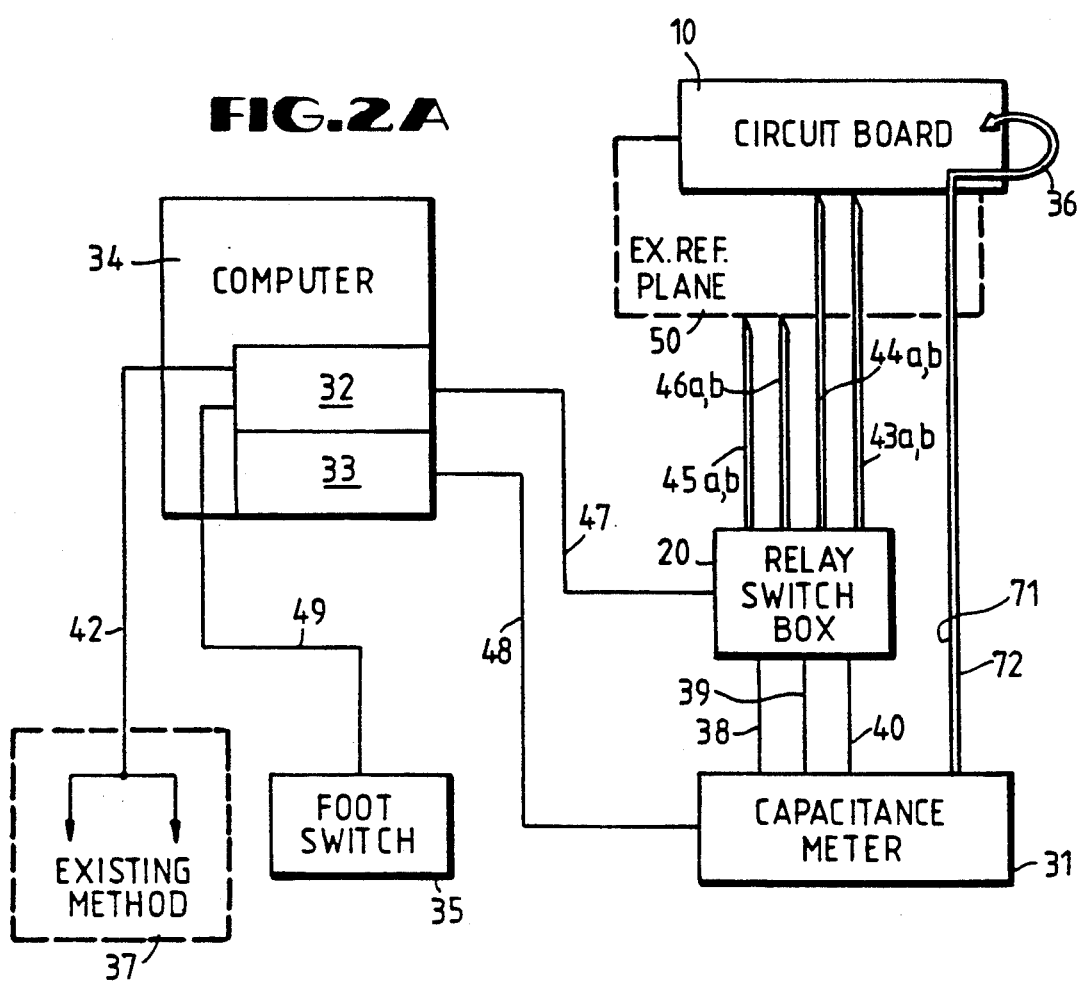
FIG. 2A is a representation of the apparatus of the preferred embodiment and its interconnection.
Figure 2B:
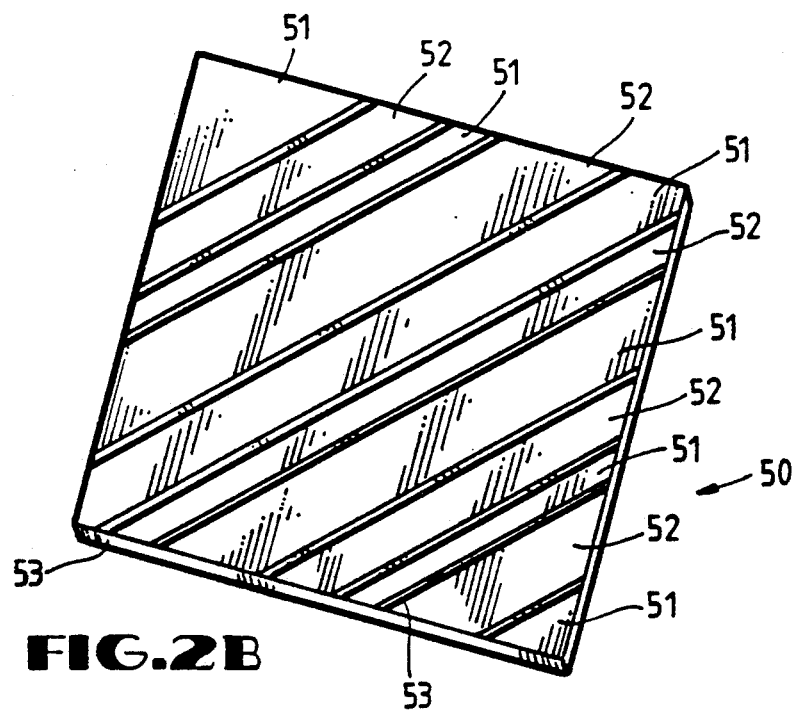
FIG. 2B is a representation of a special purpose reference plane.
Figure 2E:
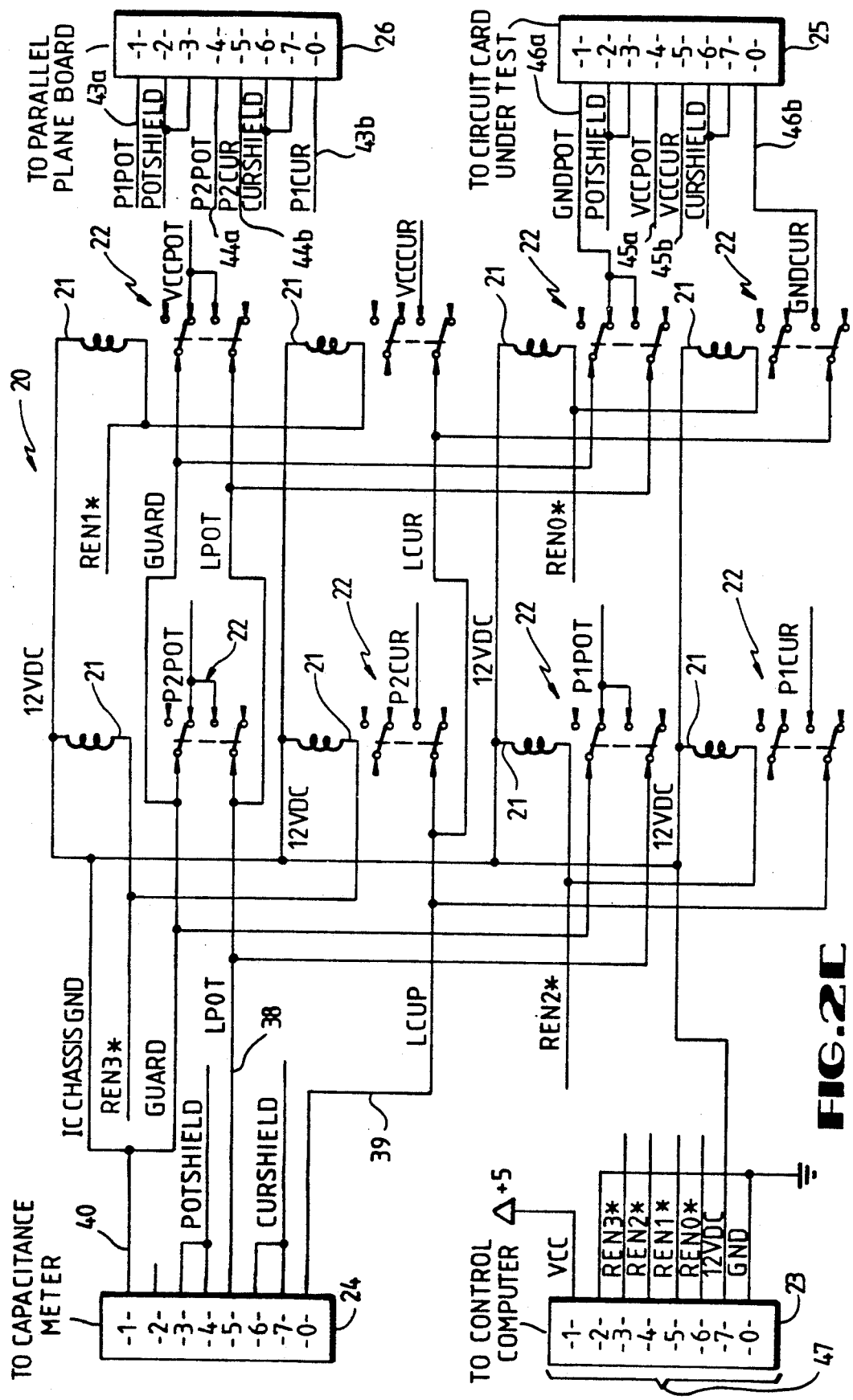
FIG. 2C is a representation of the switches of a relay switch box.

The construction of an external reference conducting surface 50 is illustrated in FIG. 2B. External reference conducting surface 50, as illustrated, contains two planes. The first plane is formed by conducting strips 51 which conductively communicate, by means not shown, and the second plane is formed by conducting strips 52 which conductively communicate, by means not shown. Strips 51 and 52 are otherwise insulated from each other.

Most traces 15 on circuit boards 10 run parallel to the edges of the board. External reference conducting surface 50 is designed such that it can be oriented with respect to board 11 so that its conducting strips, if projected onto board 11, would form an approximate 45° angle with the sides of the board. Such may be of value in the following situation. Two traces of equal length and contained within the same layer on a circuit board may not be on the same net but may appear to be on the same net from capacitance measurements taken with respect to a reference plane in the board itself. For instance, the capacitance measurements of each trace to the ground and power planes of the board may be nearly identical. However, capacitive measurements between these traces and the oriented planes of external reference conducting surface 50 may differ and thereby serve to identify the two traces as being on different nets. As can be seen, the strips that comprise the reference planes on conducting surface 50 are not of equal width, further adding to the possibility of generating distinguishing responses between otherwise similar traces.

FIG. 2A illustrates the hardware configuration and its interrelationship for use in the preferred embodiment. The hardware is comprised of capacitance meter 31, computer 34, and relay switch box 20, in addition to board 10 and external reference conducting surface 50. Foot switch 35 and connection 42 to continuity method equipment 37 is also provided. Each conducting surface and its interrelationship and function within the whole is described below.

A high precision capacitance meter 31, such as the Hewlett Packard HP4278A, provides the source of the electrical stimulus and the measuring means for measuring the capacitance response in the preferred embodiment. The capacitance meter 31 communicates with board 10, in part, through relay switch box 20. The capacitance meter 31 provides for a first potential line 38 and current line 39. Meter 31 also offers a ground or guard line 40. In the preferred embodiment, these lines are connected to relay switch box 20. Depending upon the control signals received from computer 34, the relay switch box 20 connects the first current and potential lines 39 and 38 from the capacitance meter 31 to one of four possible reference planes, two within circuit board 10 and two within external reference conducting surface 50. The relay switch box 20 connects the ground or guard line 40 from capacitance meter 31 to the remaining reference planes that are not selected to be connected to the potential and current lines 38 and 39. Probe 36, which may be specially constructed to communicate facilely between the nodes of circuit board 10 and meter 31, is to be manually placed upon a node of interest on board 10 by the operator. The probe 36 is connected to capacitance meter 31 by second potential and current lines 71 and 72. Preferably second potential and current lines 71 and 72 are connected together at probe 36 to allow proper operation of capacitance meter 31. Response data measured by capacitance meter 31 are communicated via line 48 to the computer 34. Interface card 33, installed in computer 34, receives the response data. Preferably, interface card 33 conforms to the IEEE-488 standard.

Relay switch box 20, illustrated in detail in FIG. 2C, is controlled by computer 34 through control bus 47. The control is effected through a custom control circuit card 32 installed in computer 34 that interfaces the control software in computer 34 With the requisite control signals to be output on control bus 47. Power and control information enter box 20 from computer 34 through control bus 47 into connector plug 23. Power line 12 VDC from the computer operates the eight relay coils 21 of relay switch box 20. Relay coils 21 activate their associated contacts 22 to the normally open position when energized and to the normally closed position when deenergized. A series of four signals, referred to as REN0*, REN1*, REN2*, and REN3*, are provided over the control bus 47 to relay box 20 at connector plug 23. Each signal is associated with one pair of relay coils 21 and contacts 22. It is anticipated that only one signal among REN0*, REN1*, REN2*, or REN3* will be on, or active, at one time. When an REN* signal is off, or not active, the pair of contacts 22 associated with that REN* signal will be in the normally closed position which connects the respective outputs, P1POT, P2POT, VCCPOT, and/or GNDPOT, as the case may be, to the guard line 40 input from the capacitance meter 31. When a REN* signal is on, or active, the contacts 22 associated with that REN* will be in the normally open position, which connects the respective outputs, P1CUR, P2CUR, VCCCUR, or GNDCUR as the case may be, to the current line 39 and connects P1POT, P2POT, VCCPOT, or GNDPOT, as the case may be, to potential line 38 from capacitance meter 31. Connectors 25 and 26, located on the right side of FIG. 2C, provide for four sets of measurement lines, each set comprising a potential and a current line. Both the potential and current measurement lines for one pair have been labeled by the same number, either 43, 44, 45, or 46, with the letter "a" representing the potential line and the letter "b" representing the current line, for convenience in FIG. 2C. The pairs of lines 43, 44, 45, and 46 connect to the various reference planes. In the preferred embodiment, lines 43 and lines 44 connect to reference planes within circuit board 10 and lines 45 and 46 connect to planes within external reference conducting surface 50. The potential and current lines in each pair are preferably connected together at the reference plane contact point to allow proper operation of capacitance meter 31.

Foot switch 35 is provided in the preferred embodiment to interface with custom control circuit card 32 of computer 34. Foot switch 35 provides one convenient method for the operator to indicate when a probe has been moved to the next node of interest and thus when it is time to measure a set of response data.

Computer 34, controlled by special purpose software, provides the means to automate the operation of the present invention. When foot switch 35 indicates that it is time to take measurements, computer 34, by means described above, including the use of the signals REN0*, REN1*, REN2*, and REN3*, institutes the sequential connection of the desired reference planes with capacitance meter 31 and the measurement of response data from the node by meter 31. Computer 34 further collects and stores the response data measured by meter 31. After all nodes have been interrogated, computer 34, utilizing appropriate software, determines a net list comprised of a plurality of nets for circuit board 10. Eventually, it is envisioned that the computer could also be used to automate movement of the probe instead of requiring placement by an operator. The preferred embodiment further provides means 42 connected to computer 34, and some embodiment of prior art continuity method 37, for determining residual nets.

Figure 3:
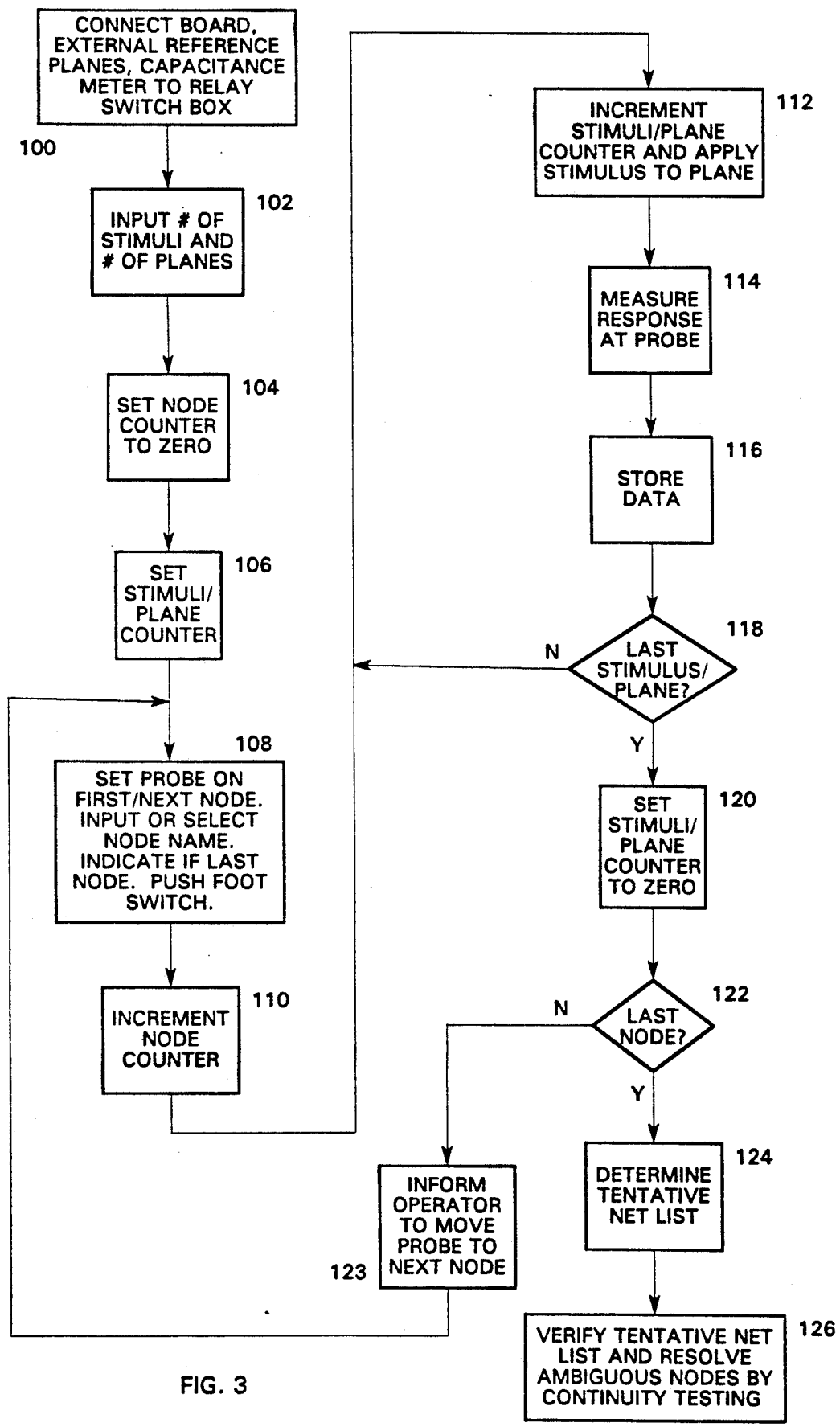
FIG. 3 is a flow chart of the general method of the preferred embodiment.

FIG. 3 illustrates the operation of the present invention. FIG. 3 presumes that the board 10 to be tested, the nodes of interest on the board, the proper electrical stimuli and reference planes to be used and the measuring device to be used have all been selected.

In the first step, indicated by box 100, the operator connects the selected reference conducting surfaces of circuit board 10, the planes of external reference conducting surface 50 (if used), and the capacitance meter 31 to relay switch box 20. The operator must also input into computer 34 the number of different electrical stimuli and/or reference conducting surfaces or planes to be used so that the proper number of measurements can be made at each point and proper sized data arrays developed. This step is illustrated by box 102. In an initialization step, illustrated by boxes 104 and 106, the node counter and the stimuli/plane counter within computer 34 are set to zero.

A system for assigning node names in accordance with the movement of the probe is adopted. Such system will assign a unique name to each new node to which the probe is moved. As indicated in box 108, the operator sets probe 36 on the first node of interest. The operator then pushes foot switch 35. At this point, control shifts to computer 34. In an automated procedure, the node counter is incremented as indicated by box 110, the stimuli/plane or reference surface counter is incremented, and a stimulus is applied to the appropriate reference conducting surface indicated by box 112. Effecting the application of the appropriate stimulus to the appropriate conducting surface is accomplished by computer 34 properly setting relays 21 so that a first relay is activated and the remaining relays are deactivated, thus developing a first measurement and guard plane arrangement. As indicated by boxes 114 and 116, the response data of the node in interest is measured through probe 36, communicating with capacitance meter 31, and then by line 48, communicating with computer 34. As indicated by box 116, computer 34 stores the measured data. If this was the last stimuli/-conducting surface of the stimuli and conducting surfaces to be utilized as determined in box 118, computer 34 resets the stimuli/conducting surface counter to zero at box 120 and prompts the operator to determine whether there are any more nodes of interest to be tested at box 122. If this was not the last stimuli/conducting surface as determined at box 118, computer 34 increments the stimuli/conducting surface counter and applies the next stimulus as indicated in box 112, through sending the appropriate REN* signals in the preferred embodiment, as discussed above, to activate the next measurement and reference plane arrangement. If the node tested was not the last node, as indicated by box 122, computer 34 indicates at box 123 to the operator that it is time to move the probe to the next node. The operator sets the probe on the next node, as indicated by box 108, and pushes foot switch 35. The loop is repeated wherein measured data is stored in computer 34 from the nodes tested.

When the last node has been tested, as determined at box 122, the computer 34 at box 124, according to a sorting scheme programmed therein, determines a tentative net list. The net list is a plurality of nets that, ideally, determines the nets for all nodes for which data has been measured. To the extent that there exist nodes whose data is ambiguous and whose nets could not be determined with sufficient reliability, control passes to box 126 wherein the tentative net list is verified and any ambiguities are resolved by continuity testing.

Figure 4A:
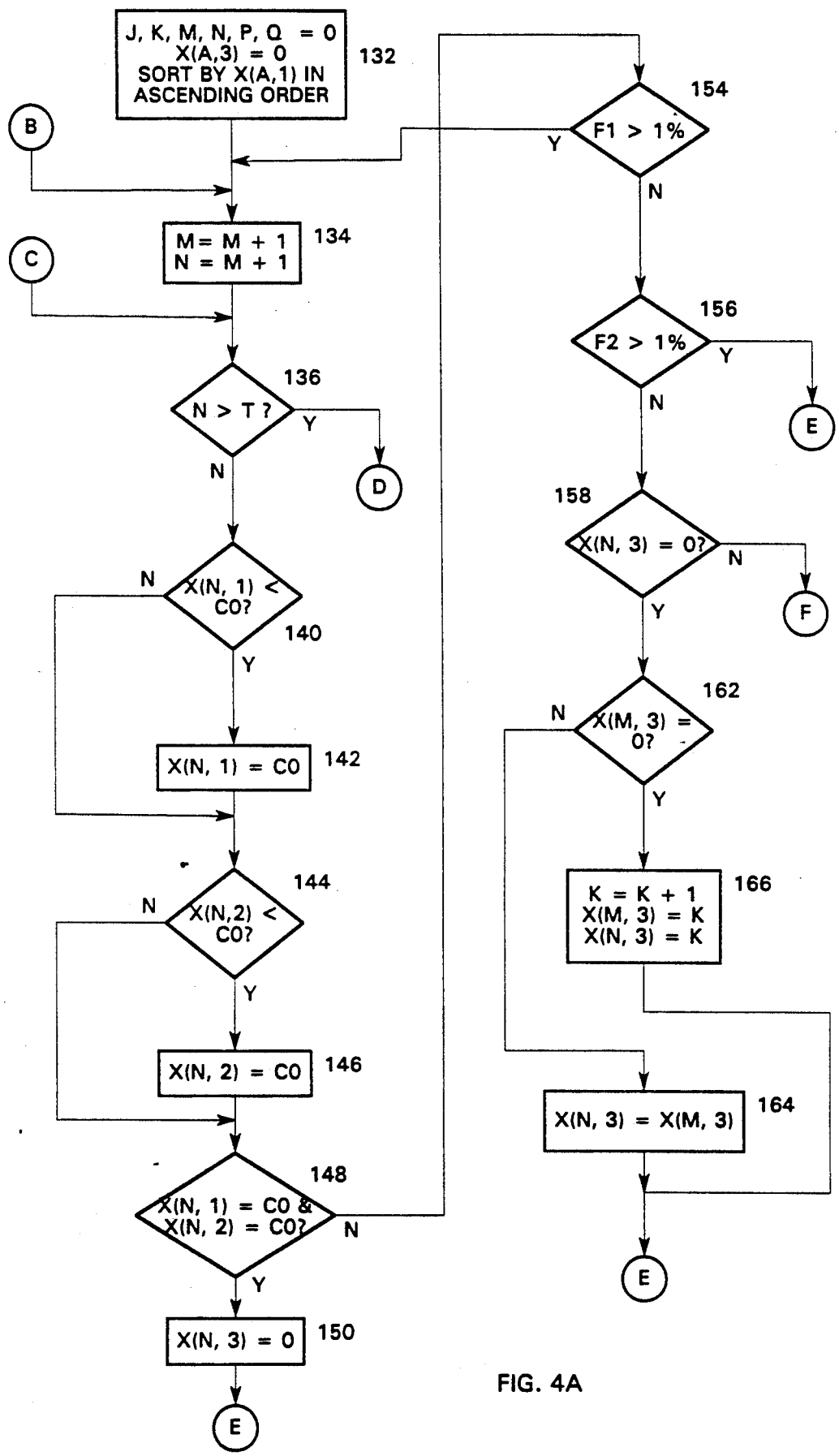
FIGS. 4A and 4B are flow charts of the preferred method for developing the tentative net list.
Figure 4B:
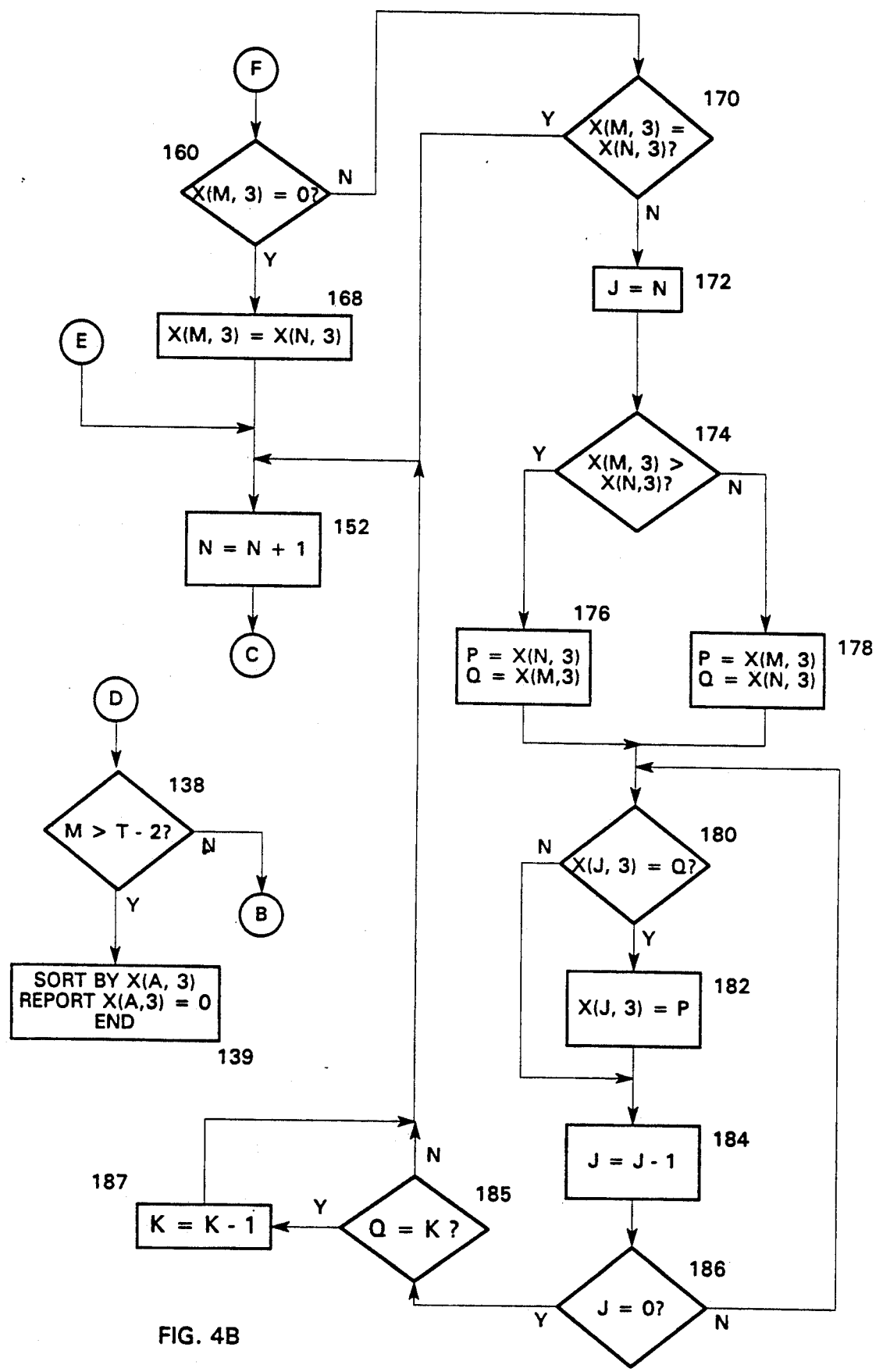

The sorting scheme of the present invention utilized in box 124 attempts to place all nodes which have similar capacitances together, giving them a net name. An illustrative sorting scheme is illustrated in FIGS. 4A and 4B. For simplicity's sake, in this sorting scheme, it is assumed that for each node two pieces of response data are measured and that the reference planes used in measurement are fixed in relation to the nodes of interest. It is clear that if three or more responses are measured, or if all reference planes are not fixed for all measurements, the sorting scheme becomes more complex, requiring more decisions and yielding more options for the determination of net membership.

FIGS. 4A and 4B presume a set of two dimensional array elements referred to as X (A, B). "A" stands for the position of the data set as arranged in the ascending order discussed below. "B" refers to four variables or indices associated with each node. The first variable comprises the node's first measured response. The second variable comprises the node's second measured response. The third variable comprises the number of the net derived by the sorting procedure to which the node has been assigned, if any. The fourth variable refers to the identifying name of the node, for example, the device location and pin number.

Two values are computed, referred to in FIG. 4A as F1 and F2. F1 is the absolute value of the difference between the first measured responses of node M and node N, divided by node M's measured response, and specified as a percentage. F2 is the absolute value of the difference of the second measured responses of node M and node N, divided by node M's measured response. The criteria adopted for placing node N and node M in the same net is that both F1 and F2 are less than or equal to a preset tolerance, chosen in this example to be 1%. J, P and Q are temporary variables used during the sorting process.

In FIGS. 4A and 4B, K is the variable which holds the last derived net number as the sorting procedure is being executed. K starts off at 0 and ends up as the total number of nets determined by the sorting scheme. T stands for the total number of nodes for which data was collected, each node having a corresponding data set. M and N are variables that serve as pointers to particular nodes as they are being sorted. J, P and Q are temporary variables used during the sorting process.

As can be seen from FIGS. 4A and 4B, the illustrated sorting scheme operates as follows. The data is first sorted in ascending order according to each nodes' first measured response, as indicated in box 132. The F1 value between the node with the lowest level of response to the first stimulus and, in ascending order, the succeeding nodes with higher levels of responses to the first stimulus is computed. If F1 is less than a specified tolerance, the F2 value between the two nodes is computed. If F2 is also less than a specified tolerance, the two nodes are placed in the same net. If neither node has been placed in a net before, the next available net list number will be assigned. If only one of the two nodes already has a net list number, the same number is assigned to the other. If both already have a net list number, and it is the same, the program just proceeds; if it is not the same, the nets are linked. Linking implies that the higher of the net list numbers is changed to the lower for every node to which the higher has been assigned.

After the sorting of box 132, operations proceed to box 134 where the node pointer variable M is incremented and the node pointer variable N is set to point to the node after that indicated by the M node pointer. Control proceeds to box 136 to determine if the N pointer is greater than the total number of nodes collected. If so, control proceeds to step 138 because one pass through the array has been completed. If not, control proceeds to box 140 where a determination is made whether the first measured response is less than a given value. This given value is generally designated such that it has a capacitance value or other value indicative of an unconnected node. If the measured response value is less than the predetermined value, control proceeds to box 142 where the measured response is set to be equal to the particular preset value. If the value is greater than the preset value in box 140 or after box 142, control proceeds to box 144 where the second measured response is compared against the predetermined value. In box 146, if the value is less than the preset value, the second measured value is set to the preset value. Control proceeds from box 144 if the value is not less than the preset value or after box 146 to box 148, where a determination is made whether both the first and second measured values are equal to the preset value. If so, this is an indication that this is tentatively determined to be an unconnected node and control proceeds to box 150 where the node number is set to 0. Control then proceeds to box 152, where the N pointer is incremented. Control then returns from box 152 to box 136 for the next pass through this particular loop.

If both measured values are not equal to the preset value, control proceeds to box 154 where it is determined whether the F1 value for the particular node pair is greater than 1%. If so, control proceeds to box 134, where the next node is set up as the master or comparison node. If not, control proceeds from box 154 to box 156 to determine if the F2 value is greater than 1% If so, control proceeds from box 156 to box 152. If the F2 value is not greater than 1%, control proceeds from box 156 to box 158 where a check is made to determine if the node number is still preset to 0. If not, control proceeds to box 160. If it is equal to 0, control proceeds to box 162 where a determination is made whether the initial node of the potential net has a node number of 0. If not, control proceeds to box 164 where the potential node to be added to the net receives a net number equal to the first node of the net. If the first node net number is equal to 0 as determined in box 162, control proceeds to box 166 where the K variable is incremented and both the first node and second node have their node numbers set to K. Control proceeds from boxes 164 and 166 to box 152 so that the initial node can be compared against the next node in the array for a development of a net.

At box 160 a determination is made whether the first node of the pair has a net number of 0. If so, control proceeds to box 168, where the first node's net number is made equal to the second node's net number. Control then proceeds to box 152 where the next node in the array is analyzed. If the first node net number is not equal to 0, control proceeds to box 170 to determine if the two nodes have equal net numbers. If so, a link has already been created and control proceeds to box 152 for the next node analysis. If not, a temporary variable is set equal to the second node N pointer number as indicated in box 172. Control then proceeds to box 174 to determine if the first node net number is greater than the second node net number. If so, in box 176 a variable referred to as P is set equal to the second node net number and a variable referred to as Q is set equal to the first node net number. If it is not greater, then control proceeds to box 178 where the P variable is made equal to the first node net number and the Q variable is made equal to the second node net number. Control proceeds from boxes 176 and 178 to box 180, where a determination is made whether the Jth node has a net number equal to the Q variable. If so, control proceeds to box 182, where the Jth node net number is made equal to the P variable. Control proceeds from box 180 if it is not equal to Q or from box 182 to box 184, where the J variable is decremented. Control proceeds to box 186 to determine if J is equal to 0. If not, control returns to box 180 and the renumbering sequence is again evaluated. If so, control proceeds to box 185, where a determination is made whether the net being removed was the last net as indicated by the K variable value. If so, the K variable is decremented in box 187. If not or after decrementing, control returns to box 152 and the next node in the array is analyzed. By this sequence all nodes where the net number is equal to the higher net number are changed to the lower net number.

In box 138 a determination is made whether the M pointer is greater than the total number of nodes less two, indicating that no more nets can be developed. If not, control returns to box 134 for determination of the next possible net. If so, control proceeds to box 139, where the array is sorted by the net number to develop a tentative ordered net list. Thus in this manner all of the nodes can be analyzed and placed into tentative net lists based on the relative measured responses.

Because of the variable sizes and variations of nets that may exist, such as short, low capacitance nets running between adjacent devices or longer, parallel nets of similar size, such as address and data lines of the memory array, it may not be possible to get a 100% resolution of the nets on a circuit board with the above described sorting procedure. Tests have disclosed that utilizing the preferred embodiment illustrated herein and capacitance measurements, the nets of approximately 90% of the nodes can be reliably determined. Because some nodes which belong to separate nets may not be resolved into their separate nets by the procedure described above, a final continuity test is performed to positively test out and confirm all nodes and all nets. This is box 126 in FIG. 3 and is shown in more detail in FIG. 5. In the preferred embodiment the operator is working with the two probes of the continuity equipment 37 for the continuity or resistance determination. The sequence begins at box 200, where the first net is started. At box 202 the operator sets the first probe on the first node of the tentative net. In box 204 the operator sets the second probe on the next connected node, as indicated by the tentative net list. Control proceeds to box 206, where the operator depresses the foot switch 35 to allow the computer 34 to make the resistance measurement. Control proceeds to box 208, where the computer determines if the test is passed, that is the particular nodes are connected. If so, control proceeds to box 210, where a determination is made whether this is the last connected node in that particular net. If not, control returns to box 204 so the operator can place the second probe on the next node. If it is the last connected node, control proceeds to box 212 where a fail flag is cleared if set. Control then proceeds to box 214 to determine if this was the last net as indicated by the tentative net list. If so, control proceeds to box 216 which is where the sequence ends, all the nets having been determined. If not, control proceeds to box 218 where an indication is provided that the next net is to be evaluated. Control then returns to box 202 for an evaluation of the next net.

If the two nodes are not connected as determined at box 208, control proceeds to box 220 where a determination is made whether the fail flag is set. The fail flag is used to indicate whether the tentative net has been broken at least one time. If the flag has not been set, control proceeds to box 222 where the fail flag is set. Control then proceeds to box 224 where a new net is created for that particular node, this net number being greater than the last previously used net number. The node under test is then assigned to this particular new net. If the fail flag was set in box 220 or after box 224, control proceeds to box 226 where the node is removed from the current net under test and added to this new net. Control then proceeds to box 210.

Figure 5:
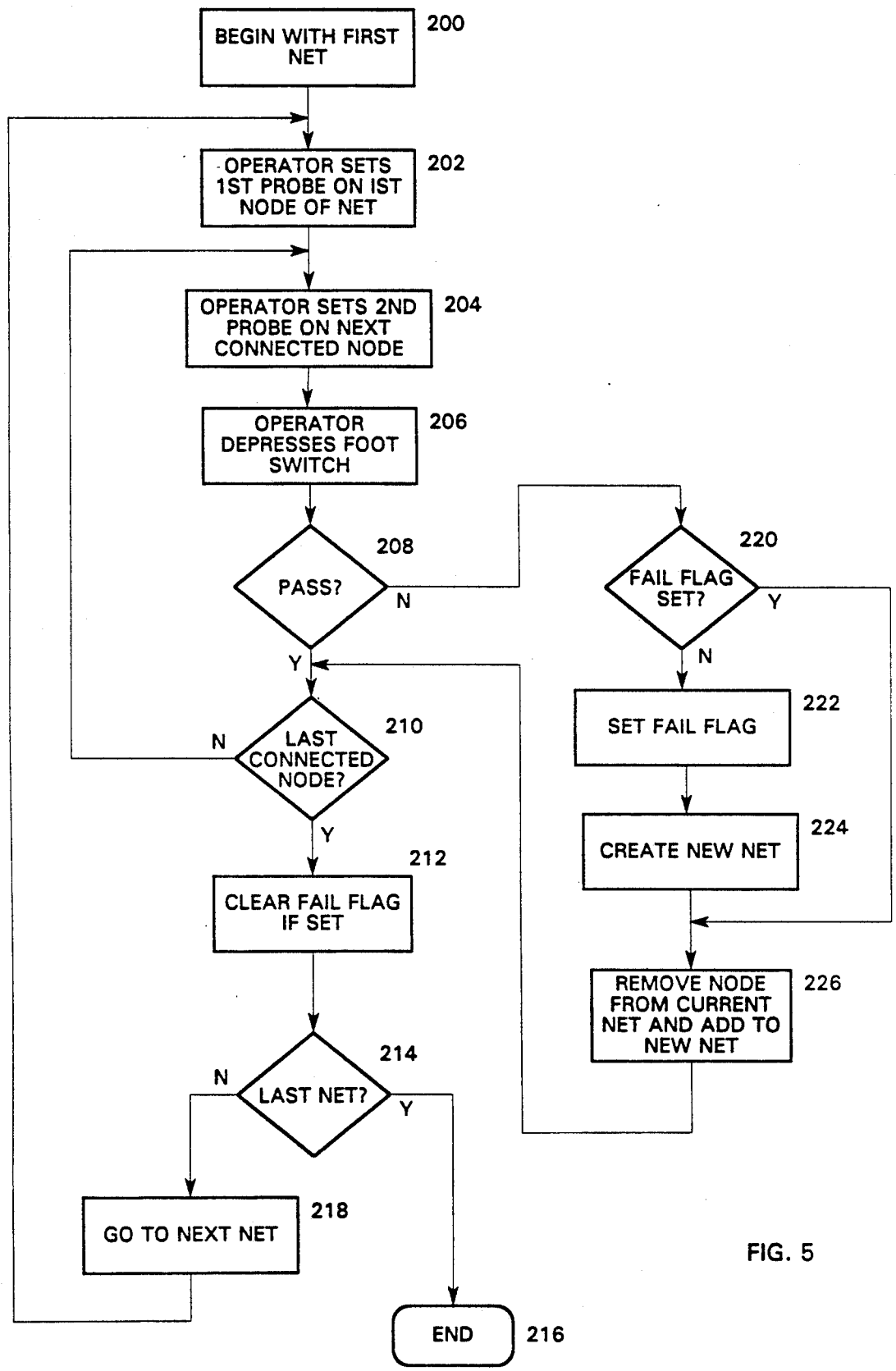
FIG. 5 is a flow chart of the preferred method for verifying the tentative net list and resolving ambiguities.

It is noted that the routine of FIG. 5 continues until all nets are completed and all the nodes have been positively placed in a net or determined to be unconnected. It is specifically noted that the nets newly added in steps 220-226 are tested. Further, all ambiguous nodes will be assigned a net number and either be connected to other nodes to form a net or be determined to be unconnected. While it would appear that operation of the sequence would involve a large number of measurements, particularly when reviewing ambiguous nodes, the number of measurements is still significantly less than that required in the conventional technique where every node has to be measured against every other node. Because of the measurements and selection done to develop the tentative net list, in many cases only a single node to node comparison for the limited number of nodes in a net has to be performed for most nets, so that the number of all nodes to all other nodes comparisons is drastically reduced. This allows the method of the preferred embodiment to greatly speed up the determination of all the nets on a particular circuit board.

The foregoing disclosure and description of the invention are illustrative and explanatory thereof, and various changes in the size, shape, materials, components, circuit elements, wiring connections, and contacts, as well as in the details of the illustrated circuitry and construction and descriptions of the procedures involved may be made without departing from the spirit of the invention.

What is claimed is:

1. A method for determining nets among nodes in a circuit board, comprising:
    applying an electrical stimulus to a reference conducting surface oriented with respect to the nets of the board;
    measuring a parameter of an electrical response caused by said electrical stimulus at the nodes of interest on the board; and
    comparing the measurements to determine a plurality of nets among the nodes.

2. The method of claim 1, wherein an electrical stimulus is applied to a plurality of reference conducting surfaces.

3. The method of claim 2, wherein the electrical stimulus is a potential.

4. The method of claim 1, wherein a plurality of electrical stimuli are applied to said reference conducting surface.

5. The method of claim 1, wherein said reference conducting surface is within the board under test.

6. The method of claim 5, wherein the on-board reference conducting surface is the ground plane of the board.

7. The method of claim 5, wherein the on-board reference conducting surface is the power plane of the board.

8. The method of claim 1, wherein said reference conducting surface is external to the circuit board under test.

9. The method of claim 4 that further comprises guarding one reference conducting surface when an electrical stimulus is applied to another reference conducting surface.

10. The method of claim 1, further comprising:
    verifying the nets determined from the measurements.

11. The method of claim 10, wherein the step of verifying includes performing continuity tests.

12. An apparatus for determining nets between nodes in a circuit board, comprising:
    a reference conducting surface oriented with respect to the board;
    means for applying an electrical stimulus to the reference conducting surface;
    means for measuring a parameter of an electrical response caused by said electrical stimulus at the nodes of interest on the board; and
    means coupled to said measuring means for storing said measured parameter and for determining a plurality of nets among the nodes from the measured parameter data.

13. The apparatus of claim 12, further comprising:
    additional conducting surfaces oriented with respect to the board, and
    wherein the means for applying includes means for applying an electrical stimulus to the plurality of conducting surfaces.

14. The apparatus of claim 13, wherein the means for storing the measured parameter and for determining a plurality of nets comprises a data processor.

15. The apparatus of claim 14, wherein the data processor is further coupled to, and controls, the means for applying.

16. The apparatus of claim 15, wherein the applying means includes:
    means for developing a potential signal; and
    means, coupled to the potential signal developing means, the applying means, and the data processor, for switching the application of potential between the plurality of conducting surfaces.

17. The apparatus of claim 16, wherein the data processor controls the switching means.

18. The apparatus of claim 12, wherein the means for applying said electrical stimulus comprises a capacitance meter.

19. The apparatus of claim 12, further comprising:
    means coupled to the net determining means and the board for verifying the nets determined from the measurements.

20. The apparatus of claim 19, wherein said verifying means includes means for performing continuity tests.

* * * * *